United States Patent
Chiba et al.

(10) Patent No.: US 11,860,233 B2
(45) Date of Patent: Jan. 2, 2024

(54) BATTERY UNIT

(71) Applicant: HONDA MOTOR CO., LTD., Tokyo (JP)

(72) Inventors: Kazuki Chiba, Saitama (JP); Masahiro Ohta, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/818,002

(22) Filed: Aug. 8, 2022

(65) Prior Publication Data
US 2023/0091279 A1 Mar. 23, 2023

(30) Foreign Application Priority Data
Sep. 22, 2021 (JP) ................... 2021-154506

(51) Int. Cl.
*G01R 31/374* (2019.01)
*H01M 10/48* (2006.01)
(Continued)

(52) U.S. Cl.
CPC ......... *G01R 31/374* (2019.01); *G01R 31/367* (2019.01); *G01R 31/3842* (2019.01); *G01R 31/392* (2019.01); *G01R 31/396* (2019.01); *H01M 10/425* (2013.01); *H01M 10/44* (2013.01); *H01M 10/486* (2013.01); *H02J 7/0048* (2020.01); *H01M 2010/4271* (2013.01)

(58) Field of Classification Search
None
See application file for complete search history.

(56) References Cited

U.S. PATENT DOCUMENTS

| 2010/0052617 A1 | 3/2010 | Aridome et al. |
| 2012/0166116 A1 | 6/2012 | Yoshida et al. |
| 2019/0187004 A1* | 6/2019 | Durrer ............... G01K 17/20 |

FOREIGN PATENT DOCUMENTS

| JP | 5044511 B2 | 10/2012 |
| JP | 5287844 B2 | 9/2013 |

OTHER PUBLICATIONS

G.Assat et al., "Probing the thermal effects of voltage hysteresis in anionic redox-based lithium-rich cathoodes using sothermal calorimetry", Nature Energy, vol. 4, Aug. 2019, pp. 647-656.

* cited by examiner

*Primary Examiner* — Jas A Sanghera
(74) *Attorney, Agent, or Firm* — CKC & PARTNERS CO., LLC

(57) ABSTRACT

The battery unit includes a storage configured to store (A1) and (A2) below, and a battery state estimator.
 (A1): a table map OCV vs. SOC characteristics.
 (A2): HF vs. SOC initial characteristics.
The battery state estimator estimates, based on (A1), a start SOC corresponding to a detected OCV at a start of charge; measures HF vs. SOC present characteristics and detects a peak of differential characteristics of the measured HF vs. SOC present characteristics during the charge; determines a SOC at the detected peak as a SOC(HF) based on (A2); calculates a charge capacity from the start of the charge to detection of the peak; calculates a SOC(OCV) based on the calculated charge capacity and the start SOC; and in a case where the SOC(OCV) deviates with respect to the SOC(HF) by an amount of deviation equal to or greater than a predetermined value, corrects (A1).

16 Claims, 9 Drawing Sheets

(51) Int. Cl.
*H01M 10/42* (2006.01)
*H01M 10/44* (2006.01)
*G01R 31/392* (2019.01)
*G01R 31/3842* (2019.01)
*G01R 31/367* (2019.01)
*H02J 7/00* (2006.01)
*G01R 31/396* (2019.01)

BATTERY UNIT

This application is based on and claims the benefit of priority from Japanese Patent Application No. 2021-154506, filed on 22 Sep. 2021, the content of which is incorporated herein by reference.

BACKGROUND OF THE INVENTION

Field of the Invention

The present disclosure relates to a battery unit.

Related Art

In recent years, battery units have been widely used as energy sources for driving widespread electric devices and electronic devices of various sizes, such as automobiles, personal computers, and information terminals. In particular, in the field of automobiles, interest in electric vehicles is growing, and use of the battery units as vehicle-mountable devices is under study, in order to reduce adverse global environmental impact and in order to reduce $CO_2$ and improve the global environment from the viewpoint of climate-related hazards and natural disasters.

A technique for estimating a state of battery cells in a battery unit, such as a state of charge (SOC) or a state of health (SOH) plays an important role in efficiently and safely using the electronic devices and electrical devices. For example, it has been known that a state of battery cells such as the SOC or the SOH correlates with a voltage of the battery cells. There are known techniques according to which a state of the battery cells, such as the SOC or the SOH, is estimated based on a voltage of the battery cells (for example, see Patent Documents 1 and 2).

Patent Document 1: Japanese Patent No. 5287844
Patent Document 2: Japanese Patent No. 5044511
Non-Patent Document 1: G. Assat et al., "Probing the thermal effects of voltage hysteresis in anionic redox-based lithium-rich cathodes using isothermal calorimetry", Nature Energy, volume 4, August 2019, pp. 647-656

SUMMARY OF THE INVENTION

The present disclosure relates to a technique for estimating the SOC as a state of a battery cell. The SOC can be estimated in the following manner. Open circuit voltage (OCV) vs. SOC characteristics of a battery cell are stored in advance in the form of a plurality of table maps associated with respective temperatures. For example, when neither charge nor discharge is being performed, one of the table maps corresponding to a detected temperature is referred to, thereby a SOC corresponding to a detected OCV is estimated as the SOC of the battery cell.

Thus, in the case of a battery cell in which the voltage is inclined with respect to a change in capacity, such as a lithium-ion battery including hard carbon as a material for the negative electrode, the SOC can be accurately estimated based on the voltage of the battery cell.

Meanwhile, battery cells have been recently used in which a change in voltage is small relative to a change in capacity, such as a lithium ion-battery including graphite as a material for the negative electrode. In the case of a battery unit including such battery cells, estimating a SOC based on the voltage of the battery cells results in low estimation accuracy.

Further, since the OCV vs. SOC characteristics gradually change due to degradation of a battery cell, the OCV vs. SOC characteristics gradually deviate from the initial characteristics. In this respect, the present inventors have devised a method of correcting an error in SOC estimation for a lithium-ion battery including graphite, by way of periodical measurement of closed circuit voltage (CCV) vs. SOC present characteristics at the time of charge during actual use. By performing charge with a constant current and at a low rate, the capacity mAh can be calculated based on the charge current mA and the charge time h.

Specifically, in the case of a lithium-ion battery including graphite, CCV vs. SOC differential characteristics, i.e., differential characteristics d(CCV)/d(SOC) of CCV characteristics CCV=f(SOC) with respect to the SOC, have peaks caused by phase transition of graphite or the like. However, two peaks are clear among the peaks. Therefore, the table maps of the OCV vs. SOC characteristics are corrected in accordance with an amount of deviation of the SOC with respect to the SOC at the peak of CCV vs. SOC differential characteristics, the amount of deviation being estimated from the table maps of the OCV vs. SOC characteristics. It should be noted that a lithium-ion battery including hard carbon does not have such a feature in which CCV vs. SOC characteristics have peaks due to a phase transition or the like.

However, the peaks of the CCV vs. SOC differential characteristics have relatively small magnitudes, relatively obtuse spectra, and relatively small S/N ratios. In particular, when the battery cell is degraded, this disadvantage becomes noticeable. For this reason, it is expected that a relatively low estimation accuracy can be achieved even if SOC estimation is corrected based on the CCV vs. SOC differential characteristics.

An object of the present disclosure is to provide a battery unit that increases accuracy of SOC estimation for a battery cell.

The present inventors have found that a SOC of a battery cell correlates also with a heat flow HF of the battery cell caused by, for example, phase transition of an active material of an electrode material. The present inventors have further found that in comparison with the CCV vs. SOC differential characteristics, the HF vs. SOC differential characteristics have feature in which:
  peaks have larger magnitudes, shaper spectra, lager S/N ratios, and maintain these characteristics even when the battery cells are degraded;
  the number of the peaks is greater and the intervals between the peaks are shorter; and
  plus peaks and minus peaks have a respective specific pattern, and even when the battery cells are degraded, the specific pattern maintains a certain pattern, in other words, the peaks are unlikely to deviate in position relative to the SOC even when the battery cells are degraded.

Accordingly, the present inventors have devised a method of correcting SoC estimation for a battery cell, based on a heat flow of the battery cell, specifically, HF vs. SOC characteristics, and more specifically, HF vs. SOC differential characteristics.

A battery unit according to a first aspect of the present disclosure includes: a battery module including a battery cell; a voltage detector configured to detect an open circuit voltage or a closed circuit voltage of the battery cell; a current detector configured to detect a current of the battery cell; a battery heat flow detector configured to detect a heat flow of the battery cell; a storage configured to store (A1) and (A2) below, (A1): a table map of open circuit voltage OCV vs. state of charge SOC characteristics of the battery cell, and (A2): heat flow HF vs. SOC initial characteristics of the battery cell, and states of charges at peaks of differential characteristics of the HF vs. SOC initial characteristics; and a battery state estimator configured to estimate a SOC of the battery cell corresponding to a detected open circuit voltage of the battery cell, based on (A1) above. (i) at a start of charge of the battery cell, the battery state estimator estimates, as a start SOC, a SOC of the battery cell corresponding to the open circuit voltage of the battery cell detected by the voltage detector, based on (A1) above, (ii) during the charge of the battery cell, the battery state estimator measures HF vs. SOC present characteristics of the battery cell, based on the heat flow of the battery cell detected by the battery heat flow detector, detects a peak of differential characteristics of the measured HF vs. SOC present characteristics, and determines a SOC at the detected peak as a SOC(HF), based on (A2) above, (iii) the battery state estimator calculates a charge capacity from the start of the charge to detection of the peak, based on a charge current detected by the current detector and a charge time, and calculates a SOC(OCV) based on the calculated charge capacity and the start SOC estimated at the start of the charge, and in a case where the SOC(OCV) deviates with respect to the SOC(HF) by an amount of deviation equal to or greater than a predetermined value, the battery state estimator corrects (A1) above based on the amount of deviation.

According to a second aspect of the present disclosure, in the battery unit, (iv) the battery state estimator may estimate a SOH of the battery cell, from a ratio between a length mAh of a line segment between peaks of the differential characteristics of the measured HF vs. SOC present characteristics and a length mAh of a line segment between the peaks of the differential characteristics of the HF vs. SOC initial characteristics stored in the storage, (V) the battery state estimator may calculate ΔSOC corresponding to the calculated charge capacity Q(t), according to formulas below;

$$\Delta SOC = Q(t)/C0(t); \text{ and}$$

$$C0(t) = C0 \times SOH, \text{ wherein}$$

C0(t) is a present overall capacity,
C0 is an initial overall capacity, and
T is an elapsed time, and
(vi) the battery state estimator may calculate the SOC (OCV) based on the calculated ΔSOC and the start SOC estimated at the start of the charge.

According to a third aspect of the present disclosure, in the battery unit, the storage may further store (A11) below, (A11): a table map of closed circuit voltage CCV vs. SOC characteristics of the battery cell, and (vii) the battery state estimator may determine, based on (A11) above, a SOC(CCV) corresponding to a closed circuit voltage detected by the voltage detector upon detection of a peak, and (viii) in a case where the SOC(CCV) deviates with respect to the SOC(HF) by an amount of deviation equal to or greater than a predetermined value, the battery state estimator may correct (A11) above based on the amount of deviation.

The present inventors have focused on an enthalpy potential (UH) calculated according to the following formula that is based on a closed circuit voltage CCV, a heat flow HF, and a current I.

$$UH = CCV - HF/I$$

The present inventors have found that in comparison with the CCV vs. SOC differential characteristics, UH vs. SOC differential characteristics also have feature in which:

peaks have larger magnitudes, shaper spectra, lager S/N ratios, and maintain these characteristics even when the battery cells are degraded;

the number of the peaks is greater and the intervals between the peaks are shorter; and plus peaks and minus peaks have a respective specific pattern, and even when the battery cells are degraded, the specific pattern maintains a certain pattern, in other words, the peaks are unlikely to deviate in position relative to the SOC even when the battery cells are degraded.

Accordingly, the present inventors have devised a method of correcting SOC estimation for a battery cell, based on an enthalpy potential of the battery cell, specifically, UH vs. SOC characteristics, and more specifically, UH vs. SOC differential characteristics.

A battery unit according to a fourth aspect of the present disclosure includes: a battery module including a battery cell; a voltage detector configured to detect an open circuit voltage or a closed circuit voltage of the battery cell; a current detector configured to detect a current of the battery cell; a battery heat flow detector configured to detect a heat flow of the battery cell; a storage configured to store (A1) and (A3) below, (A1): a table map of open circuit voltage OCV vs. state of charge SOC characteristics of the battery cell, and (A3): enthalpy potential UH vs. SOC initial characteristics of the battery cell and states of charges at peaks of differential characteristics of the UH vs. SOC initial characteristics, an enthalpy potential UH being calculated according to a formula that is based on a closed circuit voltage CCV, a heat flow HF, and a current I, and is written as UH=CCV−HF/I; and a battery state estimator configured to estimate a SOC of the battery cell corresponding to a detected open circuit voltage of the battery cell, based on (A1) above. (i) At a start of charge of the battery cell, the battery state estimator estimates, as a start SOC, a SOC of the battery cell corresponding to the open circuit voltage of the battery cell detected by the voltage detector, based on (A1) above, (ii) during the charge of the battery cell, the battery state estimator measures UH vs. SOC present characteristics of the battery cell, based on the heat flow HF, the closed circuit voltage CCV, and the current I of the battery cell that are detected by the battery heat flow detector, the voltage detector, and the current detector, respectively, detects a peak of differential characteristics of the measured UH vs. SOC present characteristics, and determines a SOC at the detected peak as a SOC(UH), based on (A3) above, (iii) the battery state estimator calculates a charge capacity from the start of the charge to detection of the peak, based on a charge current detected by the current detector and a charge time, and calculates a SOC(OCV) based on the calculated charge capacity and the start SOC estimated at the start of the charge, and in a case where the SOC(OCV) deviates with respect to the SOC(UH) by an amount of deviation equal to or greater than a predetermined value, the battery state estimator corrects (A1) above based on the amount of deviation.

According to a fifth aspect of the present disclosure, in the battery unit, (iv) the battery state estimator may estimate a SOH of the battery cell, from a ratio between a length mAh of a line segment between peaks of the differential characteristics of the measured UH vs. SOC present characteristics and a length mAh of a line segment between the peaks of the differential characteristics of the measured UH vs. SOC initial characteristics stored in the storage, (v) the battery state estimator may calculate ΔSOC corresponding to the calculated charge capacity Q(t), according to formulas below;

$\Delta SOC = Q(t)/C0(t)$; and $C0(t) = C0 \times SOH$, wherein

C0(t) is a present overall capacity,
C0 is an initial overall capacity, and
T is an elapsed time, and
(vi) the battery state estimator may calculate the SOC (OCV) based on the calculated ΔSOC and the start SOC estimated at the start of the charge.

According to a sixth aspect of the present disclosure, in the battery unit, the storage may further store (A11) below, (A11): a table map of closed circuit voltage CCV vs. SOC characteristics of the battery cell, and
(vii) the battery state estimator may determine, based on (A11) above, a SOC(CCV) corresponding to a closed circuit voltage detected by the voltage detector upon detection of a peak, and (viii) in a case where the SOC(CCV) deviates with respect to the SOC(UH) by an amount of deviation equal to or greater than a predetermined value, the battery state estimator may correct (A11) above based on the amount of deviation.

According to a seventh aspect of the present disclosure, the battery unit may further include a reference heat flow detector configured to detect, as a reference heat flow, a heat flow of the battery unit, and the battery state estimator may subtract the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

The first, second, fourth, and fifth aspects of the present disclosure make it possible to improve accuracy of correction of SOC estimation for a battery cell, in comparison with a case in which SOC estimation for a battery cell is corrected based on CCV vs. SOC differential characteristics. The third and sixth aspects of the present disclosure make it possible to correct not only the table map of the OCV vs. SOC characteristics but also the table map of the CCV vs. SOC characteristics according to degradation. The seventh aspect of the present disclosure, which is based on the heat flow excluding noise generated in the battery unit, makes it possible to further improve accuracy of correction of the SOC estimation for the battery cell, and improve accuracy of the SOC estimation for the battery cell.

DETAILED DESCRIPTION OF THE INVENTION

Figure 1:
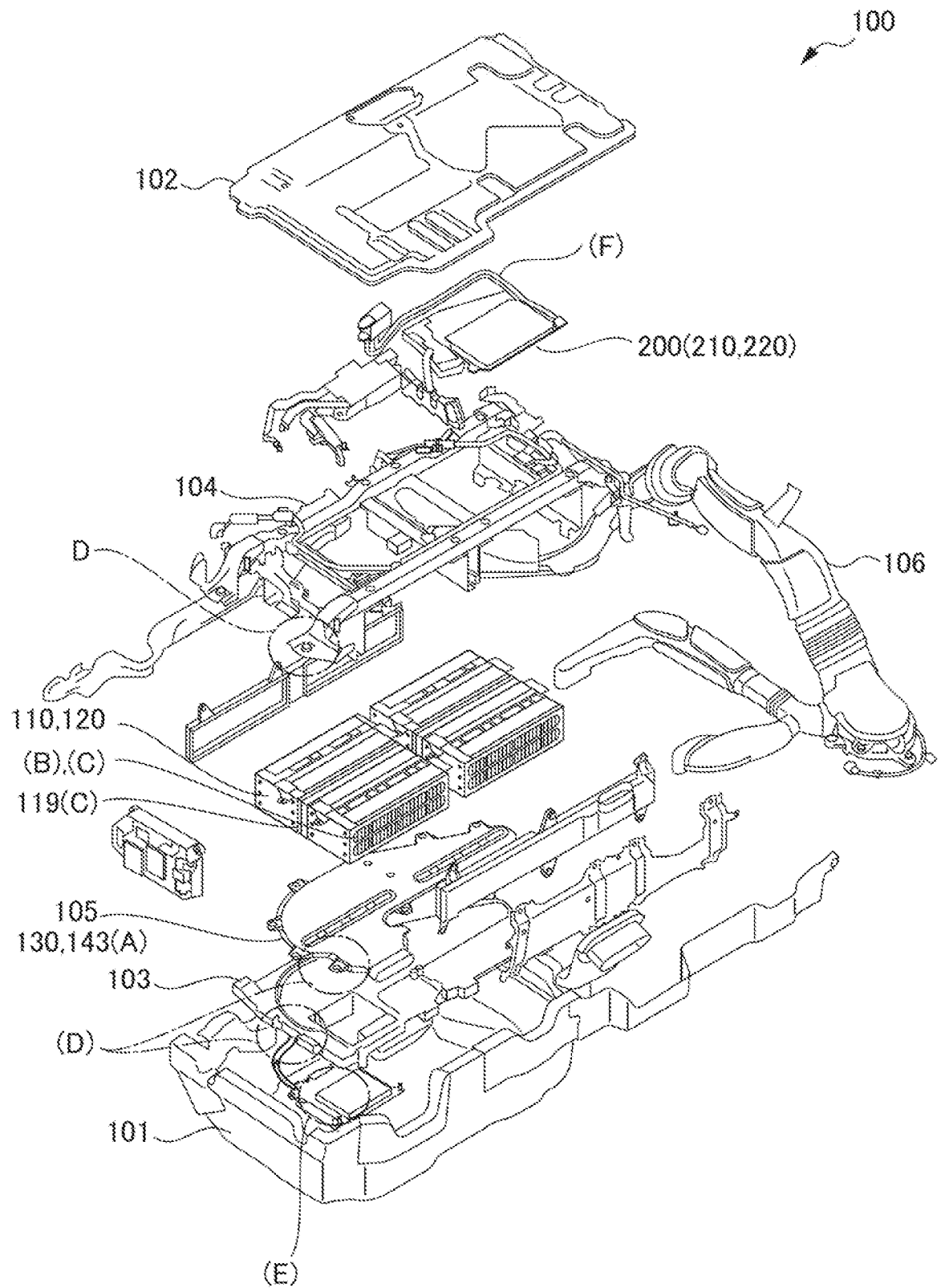
FIG. 1 is an exploded perspective view illustrating a battery unit according to an embodiment.

An example of embodiments of the present disclosure will be described below with reference to the accompanying drawings. In the drawings, the same or equivalent components are denoted by the same reference character.

(Battery Unit)

Figure 2A:
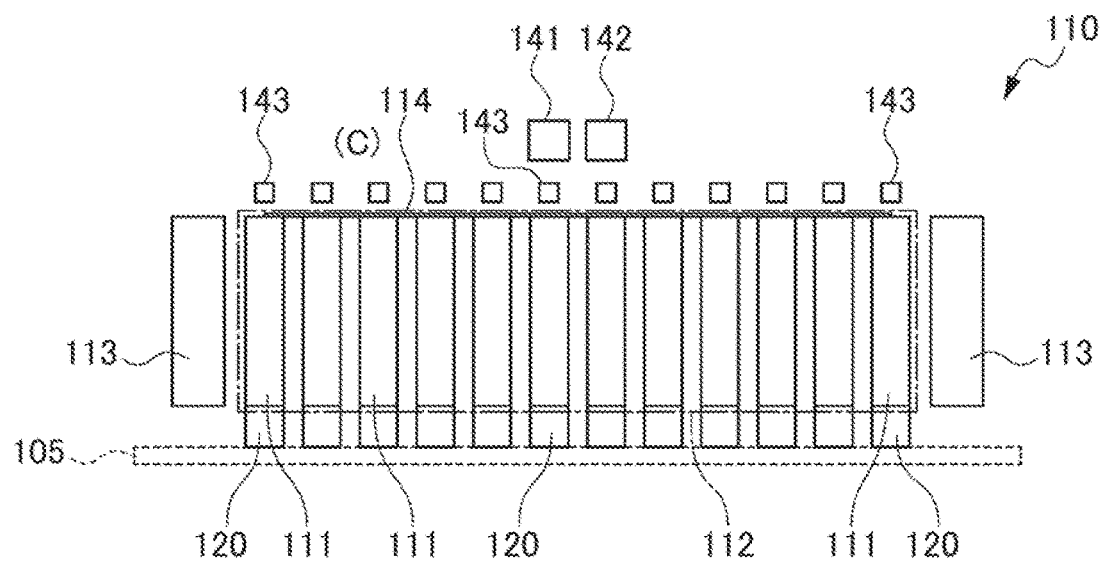
FIG. 2A is a side view of an example of a battery module in the battery unit illustrated in FIG. 1.

FIG. 1 is an exploded perspective view illustrating a battery unit according to the present embodiment. FIG. 2A is a side view illustrating an example of a battery module that can be included in the battery unit illustrated in FIG. 1. The battery unit 100 illustrated in FIG. 1 is a battery pack (also referred to as an intelligent power unit: IPU) mountable on an electric vehicle, such as a hybrid electric vehicle (HEV), a hybrid electric vehicle with an external power supply function (plug-in hybrid electric vehicle: PHEV), or a battery electric vehicle (BEV).

As illustrated in FIGS. 1 and 2A, the battery unit 100 includes, as main components, battery modules 110, battery heat flow detectors 120, a reference heat flow detector 130, a voltage detector 141, a current detector 142, temperature detectors 143, and a battery management system (BMS) 200. In the example illustrated in FIG. 1, the components of the battery unit 100 are housed in a case 101 and covered with a cover 102.

In the example illustrated in FIG. 1, the battery unit 100 further includes a lower frame 103 and an upper frame 104. The battery unit 100 further includes a lower cooling plate 105 for cooling the battery modules 110. The battery unit 100 further includes a mechanism 106 (e.g., a fan, a cooling air duct, and an intake duct) that introduces air to cool the battery modules 110.

As illustrated in FIG. 2A, each battery module 110 has, as main components, a stack 112 including a plurality of battery cells 111 stacked together, a pair of end plates 113 sandwiching the stack 112 in the stacking direction, and a cell bus bar 114 connecting the plurality of battery cells 111 to each other. As illustrated in FIG. 1, the plurality of battery modules 110 may be connected to each other via a module bus bar 119.

The battery cells 111 may be any type of battery cell, non-limiting examples of which include lithium-ion batteries. Among such lithium-ion batteries, the following battery is preferable: a lithium-ion battery with a negative electrode containing a material that generates heat due to a phase transition or the like, such as graphite; or a lithium-ion battery with a positive electrode containing a material that generates heat due to a phase transition or the like, such as lithium cobalt oxide (LCO) as a layered compound or lithium nickel oxide (LNO) as a layered compound. In the following, a lithium-ion battery will be described which includes a negative electrode containing graphite as a material that generates heat due to a phase transition or the like; and a positive electrode containing lithium nickel cobalt manganese oxide (NCM) as a layered compound (that is, for the lithium-ion battery to be described below, a SOC of 0% is mainly determined depending on a potential of the negative electrode; negative electrode cut). Note that the present disclosure can be similarly applied to a lithium-ion battery (whose SOC of 0% is mainly determined depending on a potential of the positive electrode; positive electrode cut), which includes a positive electrode containing a material such as LCO or LNO that generates heat due to a phase transition or the like.

The battery heat flow detectors 120 are heat flow sensors that detect a heat flow of the battery cells 111 and the battery unit 100. In other words, the heat flow detected by the battery heat flow detectors 120 is composed of not only the heat flow of the battery cells 111, but also a heat flow affected by various heat flows in the battery unit 100, namely effects of noise.

The heat flow sensor may be any type of sensor, non-limiting example of which include temperature sensors such as a Peltier element, a thermopile, and a thermocouple. Among these sensors, a Peltier element that has high heat flow sensitivity and can also be used as a temperature control device is preferable. As illustrated in FIG. 2A, a Peltier element for cooling the battery cells 111 may be disposed between the battery cells 111 and the cooling plate 105. In this case, the Peltier element can be used for both heat flow detection and cooling. For example, the Peltier element can be used as a heat flow sensor when a heat flow is to be detected, and otherwise, it can be used as a cooler.

It is only necessary for each battery heat flow detector 120 to be disposed on or adjacent to at least one of the battery cells 111 included in the battery module 110. As illustrated in FIG. 2A, the battery heat flow detectors 120 may be disposed on or adjacent to two of the battery cells 111, the two being located next to the end plates 113. The battery heat flow detector 120 may further be disposed on or adjacent to one battery cell 111 located at the center in the stacking direction of the battery cells 111, in addition to the two battery cells 111 next to the end plates 113.

The reference heat flow detector 130 is a heat flow sensor that detects, as a reference heat flow, a heat flow of the battery unit 100, the heat flow composed of various heat flows in the battery unit 100, namely heat flows of noise.

Similarly to the above, the heat flow sensor may be any type of sensor, non-limiting example of which include temperature sensors such as a Peltier element, a thermopile, and a thermocouple. Among these sensors, the Peltier element is preferable. The Peltier element can be used for both cooling the battery cells 11 and detecting the heat flow.

The reference heat flow detector 130 is disposed in the battery unit 100 at a location where temperature fluctuation is small and heat capacity is large. For example, the reference heat flow detector(s) 130 can be disposed at any of the following locations (A) to (F).

(A) Cooling Plate 105 for Cooling the Battery Modules 110

For example, as illustrated in FIG. 1, the cooling plate 105 is disposed in contact with the bottom surfaces of the battery modules 110, and the reference heat flow detector 130 is disposed on or adjacent to a surface of the cooling plate 105, the surface not facing the bottom surfaces of the battery cells 111. Although the reference heat flow detector 130 can be disposed at any position with respect to the plurality of battery cells 111, it may be disposed at, for example, a position corresponding to one battery cell 111 at the center in the stacking direction of the battery cells 111.

(B) End Plates 113 of the Battery Modules 110

Figure 2B:
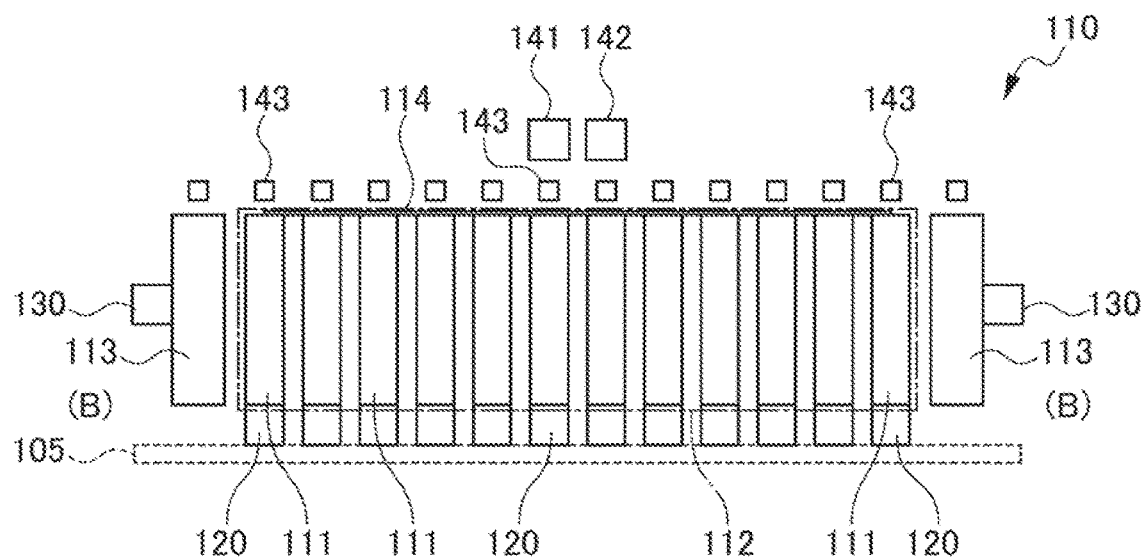
FIG. 2B is a side view of another example of the battery module in the battery unit illustrated in FIG. 1.

FIG. 2B is a side view illustrating another example of a battery module that can be included in the battery unit illustrated in FIG. 1. As illustrated in FIG. 2B, for example, the reference heat flow detector 130 may be disposed on or adjacent to a surface of each end plate 113, the surface not facing the battery cells 111.

(C) Bus Bar 114, 119 of the Battery Modules 110

For example, the reference heat flow detector 130 may be disposed on or adjacent to a surface of the cell bus bar 114 connecting the battery cells to each other (see FIG. 2A), the surface not facing the battery cells 111. For example, the reference heat flow detector 130 may be disposed on or adjacent to a surface of the module bus bar 119 connecting the battery modules 110 to each other (see FIG. 1), the surface not facing the battery cells 111. Although the reference heat flow detector 130 can be disposed at any position with respect to the plurality of battery cells 111, it may be disposed at, for example, a position corresponding to one battery cell 131 at the center in the stacking direction of the battery cells 111.

(D) Flange in the Battery Unit 100

For example, as illustrated in FIG. 1, the reference heat flow detector 130 may be disposed on or adjacent to a flange (joint) which is provided in the battery unit 100 and via which the battery modules are fixed.

(E) Space within the Battery Unit 100

For example, as illustrated in FIG. 1, the reference heat flow detector 130 may be disposed in a floating manner in a space within the battery unit 100.

(F) Pipe Protecting a High-Voltage Conductor Wire

For example, as illustrated in FIG. 1, the reference heat flow detector 130 may be disposed inside or outside a pipe that protects a high-voltage conductor wire (e.g., inside the pipe if the pipe is exposed to outside air, or outside the pipe if the pipe is not exposed to outside air).

The battery heat flow detectors 120 may be disposed on or adjacent to the two battery cells 111 that are next to the end plates 113, and the reference heat flow detector 130 may be disposed on or adjacent to one of the battery cells 111 that is different from the two on or adjacent to which the battery heat flow detectors 120 are disposed (e.g., one battery cell 111 located at the center in the stacking direction of the battery cells 111).

The voltage detector 141 is a voltage sensor that detects an open circuit voltage or a closed circuit voltage of the battery cells 111. The voltage detector 141 may be disposed at any location. For example, as illustrated in FIG. 2A, the voltage detector 141 may be disposed on or adjacent to the battery module 110.

The current detector 142 is a current sensor that detects a current of the battery cells 111. The current detector 142 may be disposed at any location. For example, as illustrated FIG. 2A, the current detector 142 may be disposed on or adjacent to the battery module 110.

The temperature detectors 143 are temperature sensors that detect temperatures of the respective components. The temperature sensor may be any type of temperature sensor, a non-limiting example of which includes a thermocouple. As illustrated in FIG. 2A, each temperature detector 143 is disposed on or adjacent to an associated one of the battery cells 111 and detects the temperature of the associated battery cell 111. The temperature detectors 143 are also disposed at the positions where the battery heat flow detectors 120 are disposed, and detect temperatures of the heat flow detection positions. As illustrated in FIGS. 1 and 2B, the temperature detectors 143 are also disposed at the positions where the reference heat flow detectors 130 are disposed, and detect temperatures of the heat flow detection positions.

(Battery Management System: Battery State Estimator)

The battery management system (BMS, also referred to as the electronic control unit: ECU) 200 performs overall control of the battery cells 111, including charge/discharge control, over-charge protection, over-discharge protection, and monitoring of a state of the battery (e.g., a state of charge (SOC) or a state of health (SOH)) of the battery cells 111. The battery management system 200 includes, as main components, a battery state estimator 210 and a storage 220.

The battery state estimator 210 includes, for example, an arithmetic processor, such as a digital signal processor (DSP) and a field-programmable gate array (FPGA). The battery state estimator 210 performs various functions by executing, for example, predetermined software (programs) stored in the storage 220. The various functions of the battery state estimator 210 may be performed by way of cooperation of hardware and software, or may be performed only by hardware (electronic circuitry).

For example, the storage 220 is a rewritable memory, such as an EEPROM. The storage 220 stores the predetermined software (programs) for allowing the battery state estimator 210 to perform the above-mentioned various functions.

Figure 3A:
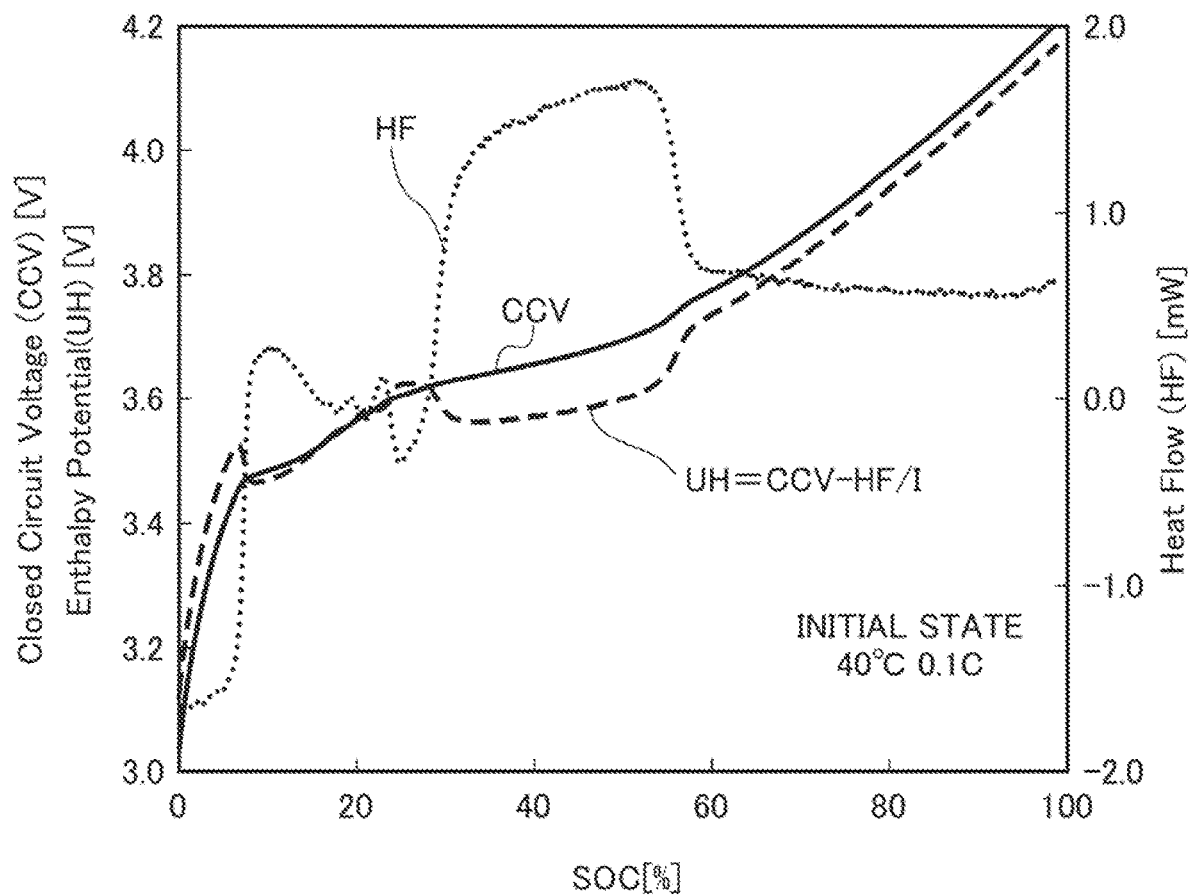
FIG. 3A illustrates, as an example, HF vs. SOC characteristics and UH vs. SOC characteristics in an initial state of the embodiment.

The storage 220 stores, in a table map format, characteristics (OCV vs. SOC characteristics) relating to a correlation between the open circuit voltage and the SOC of the battery cells 111 in, for example, an initial state, which are a plurality of characteristics of the battery cells 111 each associated with a temperature. As illustrated in FIG. 3A, the storage 220 stores, in a table map format, characteristics relating to a correlation between the closed circuit voltage and the SOC of the battery cells 111 in, for example, the initial state (CCV vs. SOC characteristics), which are a plurality of characteristics of the battery cells 111 each associated with a temperature and a current (charge). As illustrated in FIG. 3A, the storage 220 stores, in a table map format, characteristics relating to a correlation between a heat flow and the SOC of the battery cells 111 in the initial state (HF vs. SOC initial characteristics), which are a plurality of characteristics of the battery cells 111 each associated with a temperature and a current (charge). As illustrated in FIG. 3A, the storage 220 stores, in a table map format, characteristics relating to a correlation between an enthalpy potential and the SOC of the battery cells 111 in the initial state (UH vs. SOC initial characteristics), which are a plurality of characteristics of the battery cells 111 each associated with a temperature and a current (charge).

Here, the enthalpy potential UH is a parameter calculated according to the following formula that is based on the heat flow HF, the closed circuit voltage CCV, and a current I of the battery cells 111 (see Non-Patent Document 1).

$$UH = CCV - HF/I$$

When charge and discharge are not being performed, for example, when the vehicle is at standstill during actual use, the battery state estimator 210 estimates a SoC of the battery cells 111 that corresponds to an OCV of the battery cells 111 detected by the voltage detector 141, by referring to the table maps of the OCV vs. SOC characteristics stored in the storage 220. Further, at the time of a start of charge that is performed, for example, when the vehicle is at standstill during actual use, the battery state estimator 210 estimates, as a start SOC, a SOC of the battery cells 111 that corresponds to an OCV of the battery cells 111 detected by the voltage detector 141, by referring to the table maps of the OCV vs. SOC characteristics stored in the storage 220.

Figure 3B:
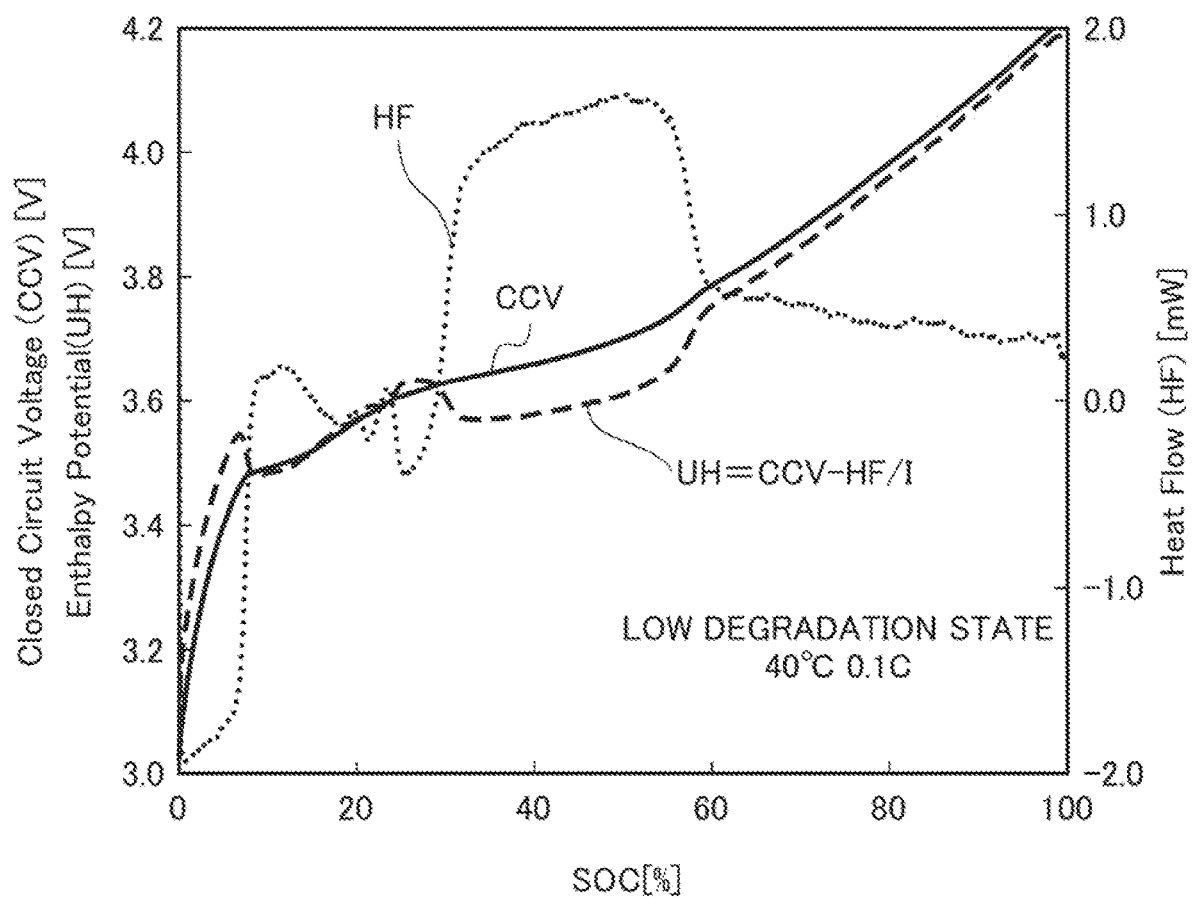
FIG. 3B illustrates, as an example, HF vs. SOC characteristics and UH vs. SOC characteristics in a low degradation state of the embodiment.
Figure 3C:
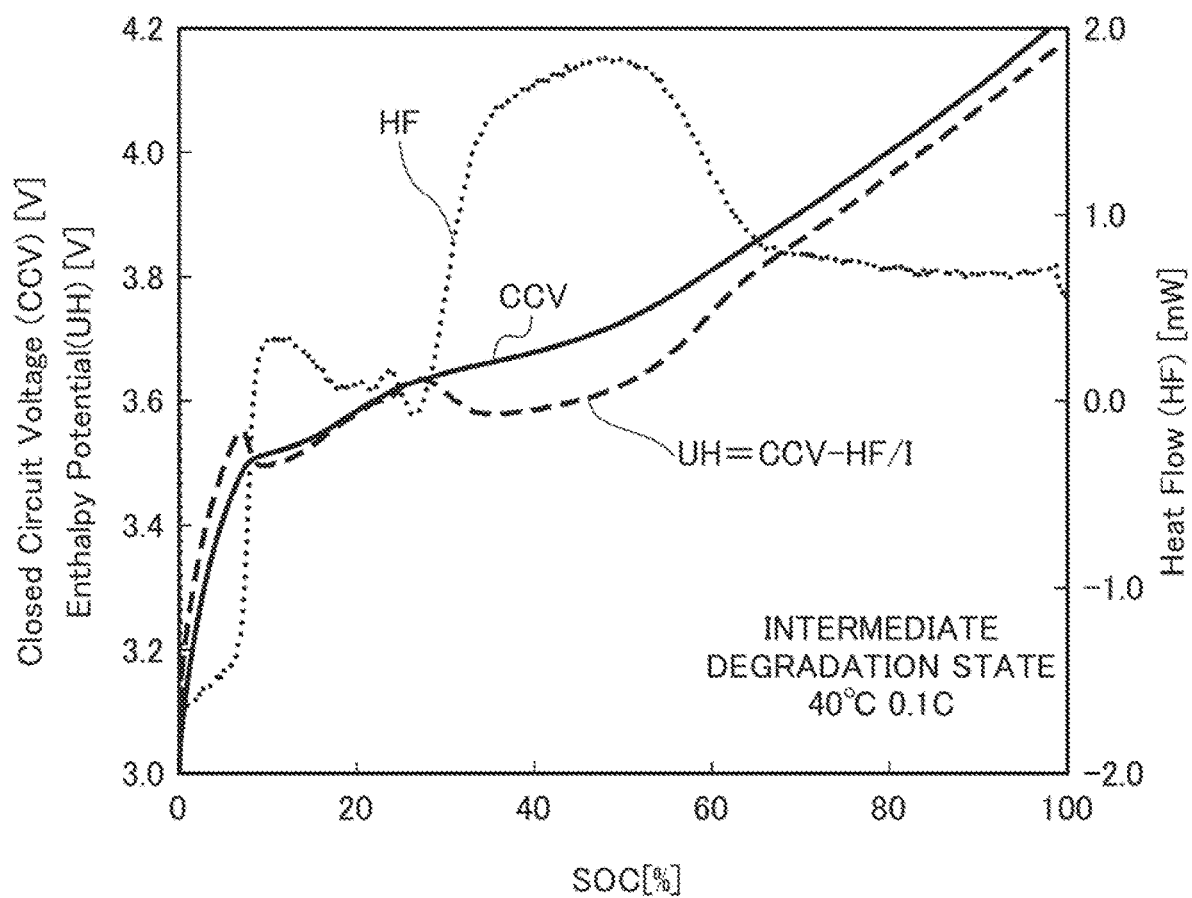
FIG. 3C illustrates, as an example, HF vs. SOC characteristics and UH vs. SOC characteristics in an intermediate degradation state of the embodiment.

Further, at the time of charge that is performed, for example, when the vehicle is at standstill during actual use, the battery state estimator 210 measures HF vs. SOC present characteristics as illustrated in FIGS. 3B and 3C, and determines a SOC(HF) of the battery cells based on a peak of differential characteristics of the measured HF vs. SOC present characteristics. At this time, the battery state estimator 210 calculates a SOC(OCV) of the battery cells that corresponds to the above-mentioned SOC(HF), based on the start SOC estimated from the table maps of the OCV vs. SOC characteristics described above. In a case where the SOC(OCV) calculated from the table maps of the OCV vs. SOC characteristics deviates with respect to the SOC(HF) determined based on the peak of the differential characteristics of the HF vs. SOC present characteristics by an amount of deviation equal to or greater than a predetermined value, the battery state estimator 210 corrects the table maps of the OCV vs. SOC characteristics based on the amount of deviation. The details of this correction (SOC Estimation Correction 1) will be described later.

Alternatively, at the time of charge that is performed, for example, when the vehicle is at standstill during actual use, the battery state estimator 210 measures UH vs. SOC present characteristics of the battery cells 111 as illustrated in FIGS. 3B and 3C, and determines a SOC(UH) of the battery cells based on a peak of differential characteristics of the measured UH vs. SOC present characteristics. At this time, the battery state estimator 210 calculates a SOC(OCV) of the battery cells that corresponds to the above-mentioned SOC (UH), based on the start SOC estimated from the table maps of the OCV vs. SOC characteristics described above. In a case where the SOC(OCV) calculated from the table maps of the OCV vs. SOC characteristics deviates with respect to the SOC(UH) determined based on the peak of the differential characteristic of the UH vs. SOC present characteristics by an amount of deviation equal to or greater than a predetermined value, the battery state estimator 210 corrects the table maps of the OCV vs. SOC characteristics based on the amount of deviation. The details of this correction (SOC Estimation Correction 2) will be described later.

Note that as the heat flow HF of the battery cells 111, a heat flow detected by the battery heat flow detector 120 may be used as it is. Alternatively, as the heat flow HF of the battery cells 111, a heat flow calculated by subtracting a reference heat flow detected by the reference heat flow detector 130 from a heat flow detected by the battery heat flow detector 120 may be used. This makes it possible to determine the heat flow of the battery cells 111 excluding effects of various heat flows in the battery unit 100, that is, excluding the effects of noise. A heat flow of the battery cells 111 on the positive electrode side and a heat flow of the battery cells 111 on the negative electrode side may be averaged to be defined as the heat flow HF of the battery cells 111.

Here, to estimate a SOC, the OCV vs. SOC characteristics of the battery cells are stored in advance in the form of a plurality of table maps associated with respective temperatures, and when charge and discharge are not being performed, for example, when the vehicle is at standstill during actual use, one of the table maps corresponding to a detected temperature is referred to, thereby a SOC corresponding to a detected OCV is estimated as the SOC of the battery cells.

The above configuration makes it possible to accurately estimate a SOC on the basis of a voltage of battery cells in the case where the battery cells are of a type in which the voltage is inclined with respect to a change in capacity, such as a lithium-ion battery including hard carbon as a material for the negative electrode.

Meanwhile, battery cells have been recently used in which a change in voltage is small relative to a change in capacity, such as a lithium ion-battery including graphite as a material for the negative electrode. In the case of a battery unit including battery cells of this type, estimating a SOC based on the voltage of the battery cells results in low estimation accuracy.

Since the OCV vs. SOC characteristics gradually change due to degradation of battery cells, the OCV vs. SOC characteristics gradually deviate from the initial characteristics. In this respect, the present inventors have devised a method of correcting an error in SOC estimation for a lithium-ion battery including graphite, by way of measurement of the CCV vs. SOC present characteristics at the time of, for example, charge that is performed while a vehicle is at standstill during actual use. By performing charge with a constant current and at a low rate, the capacity mAh can be calculated based on the charge current mA and the charge time h.

Figure 6:
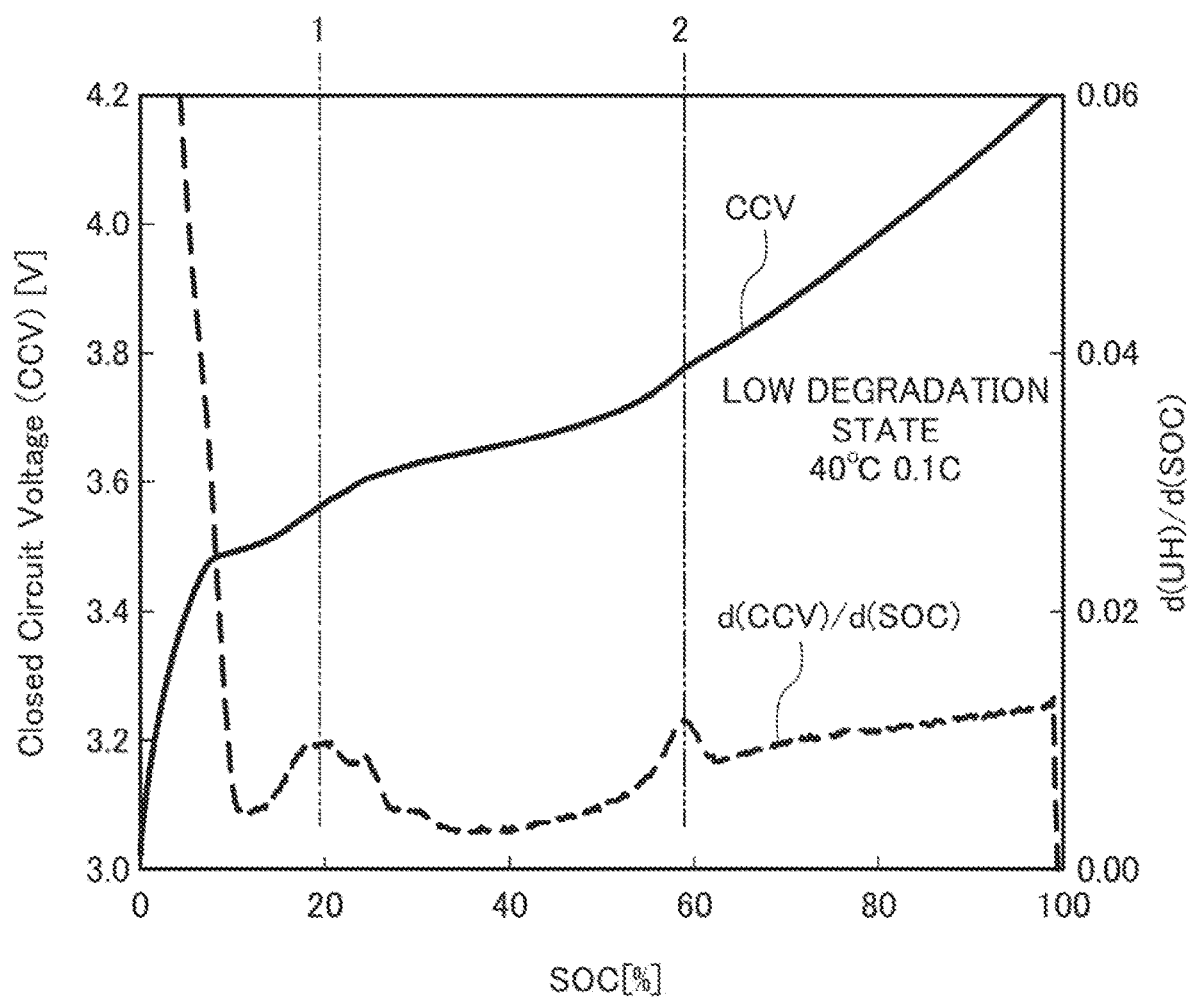
FIG. 6 illustrates, as an example, CCV vs. SOC differential characteristics (in a low degradation state) of a comparative example.

FIG. 6 is a graph corresponding to a Comparative Example and shows, as an example, the CCV vs. SOC characteristics and differential characteristics thereof, i.e., differential characteristics d(CCV)/d(SOC) of CCV characteristics CCV=f(SOC) with respect to the SOC. As illustrated in FIG. 6, for example, in the case of a lithium-ion battery including graphite as a material for the negative electrode and NCM as a material for the positive electrode, the CCV vs. SOC differential characteristics haves a plurality of peaks due to phase transition or the like corresponding to the of graphite. However, two peaks are clear among the plurality of peaks. It should be noted that a lithium-ion battery including hard carbon does not have such a feature in which CCV vs. SOC characteristics have peaks due to a phase transition or the like.

Accordingly, for the correction of SOC estimation of the Comparative Example, the table maps of the OCV vs. SOC characteristics are corrected in accordance with the amount of deviation of a SOC with respect to a SOC at a peak of CCV vs. SOC differential characteristics, the amount of the deviation being estimated from the table maps of the OCV vs. SOC characteristics.

Specifically, at the time of a start of charge that is performed, for example, when the vehicle is at standstill during actual use, a SOC that corresponds to a measured OCV is estimated as a start SOC, with reference to the table maps of the OCV vs. SOC characteristics. At the time of charge that is performed, for example, when the vehicle is at standstill during actual use, CCV vs. SOC present characteristics are measured, and a peak of differential characteristics of the measured CCV vs. SOC present characteristics is detected. For example, with reference to a SOC at a peak of differential characteristics of previously stored CCV vs. SOC initial characteristics, the SOC at the detected peak is determined as a SOC(CCV).

At this time, the charge capacity from the start of charge to the time of detection of the peak is calculated based on the charge current and the charge time, and the SOC(OCV) is calculated based on the calculated charge capacity and the start SOC estimated from the table maps of the OCV vs SOC characteristics at the start of charge as described above.

In a case where the SOC(OCV) calculated from the table maps of the OCV vs. SOC characteristics deviates with respect to the SOC(CCV) determined based on the peak of the CCV vs. SOC differential characteristics by an amount of deviation equal to or greater than a predetermined value, the table maps of the OCV vs. SOC characteristics are corrected based on the amount of deviation.

However, the peaks of the CCV vs. SOC differential characteristics have relatively small magnitudes, relatively obtuse spectra, and relatively small S/N ratios. In particular, when the battery cells are degraded, this disadvantage becomes noticeable. For this reason, it is expected that a relatively low estimation accuracy can be achieved even if the estimation of the start SOC is corrected based on the CCV vs. SOC differential characteristics.

The present inventors have found that a SOC of battery cells correlates also with a heat flow HF of the battery cells caused by, for example, phase transition of an active material of an electrode material. The present inventors have further found that in comparison with the CCV vs. SOC differential characteristics, the HF vs. SOC differential characteristics have feature in which:

peaks have larger magnitudes, shaper spectra, lager S/N ratios, and maintain these characteristics even when the battery cells are degraded;

the number of the peaks is greater and the intervals between the peaks are shorter; and plus peaks and minus peaks have a respective specific pattern, and even when the battery cells are degraded, the specific pattern maintains a certain pattern, in other words, the peaks are unlikely to deviate in position relative to the SOC even when the battery cells are degraded. Accordingly, the present inventors have devised a method of correcting SOC estimation for battery cells, based on a heat flow of the battery cells, specifically, HF vs. SOC characteristics, and more specifically, HF vs. SOC differential characteristics (SOC Estimation Correction 1 to be described later).

The present inventors have further found that in comparison with the CCV vs. SOC differential characteristics, UH vs. SOC differential characteristics also have feature in which:

peaks have larger magnitudes, shaper spectra, lager S/N ratios, and maintain these characteristics even when the battery cells are degraded;

the number of the peaks is greater and the intervals between the peaks are shorter; and plus peaks and minus peaks have a respective specific pattern, and even when the battery cells are degraded, the specific pattern maintains a certain pattern, in other words, the peaks are unlikely to deviate in position relative to the SOC even when the battery cells are degraded.

Accordingly, the present inventors have devised a method of correcting SOC estimation for battery cells, based on an enthalpy potential of the battery cells, specifically, UH vs.

SOC characteristics, and more specifically, UH vs. SOC differential characteristics (SOC Estimation Correction 2 to be described later).

(SOC Estimation Correction 1)

First, described is an example of correction of SOC estimation for the battery cells 111 that the battery state estimator 210 performs based on a heat flow of the battery cells 111, specifically, the HF vs. SOC characteristics, and more specifically, the HF vs. SOC differential characteristics.

When charge and discharge are not being performed, for example, when the vehicle is at standstill during actual use, the battery state estimator 210 periodically estimates a SOC of the battery cells 111 that corresponds to a detected OCV of the battery cells 111, by referring to the table maps of the OCV vs. SOC characteristics. At the time of a start of charge that is performed, for example, when the vehicle is at standstill during actual use, the battery state estimator 210 estimates, as a start SOC, a SOC of the battery cells 111 that corresponds to a detected OCV of the battery cells 111, by referring to the table maps of the OCV vs. SOC characteristics.

Thereafter, during the charge that is performed, for example, when the vehicle is at standstill during actual use, the battery state estimator 210 measures HF vs. SOC present characteristics of the battery cells 111 as illustrated in FIGS. 3B and 3C, and detects peaks of differential characteristics of the measured HF vs. SOC present characteristics.

Figure 4:
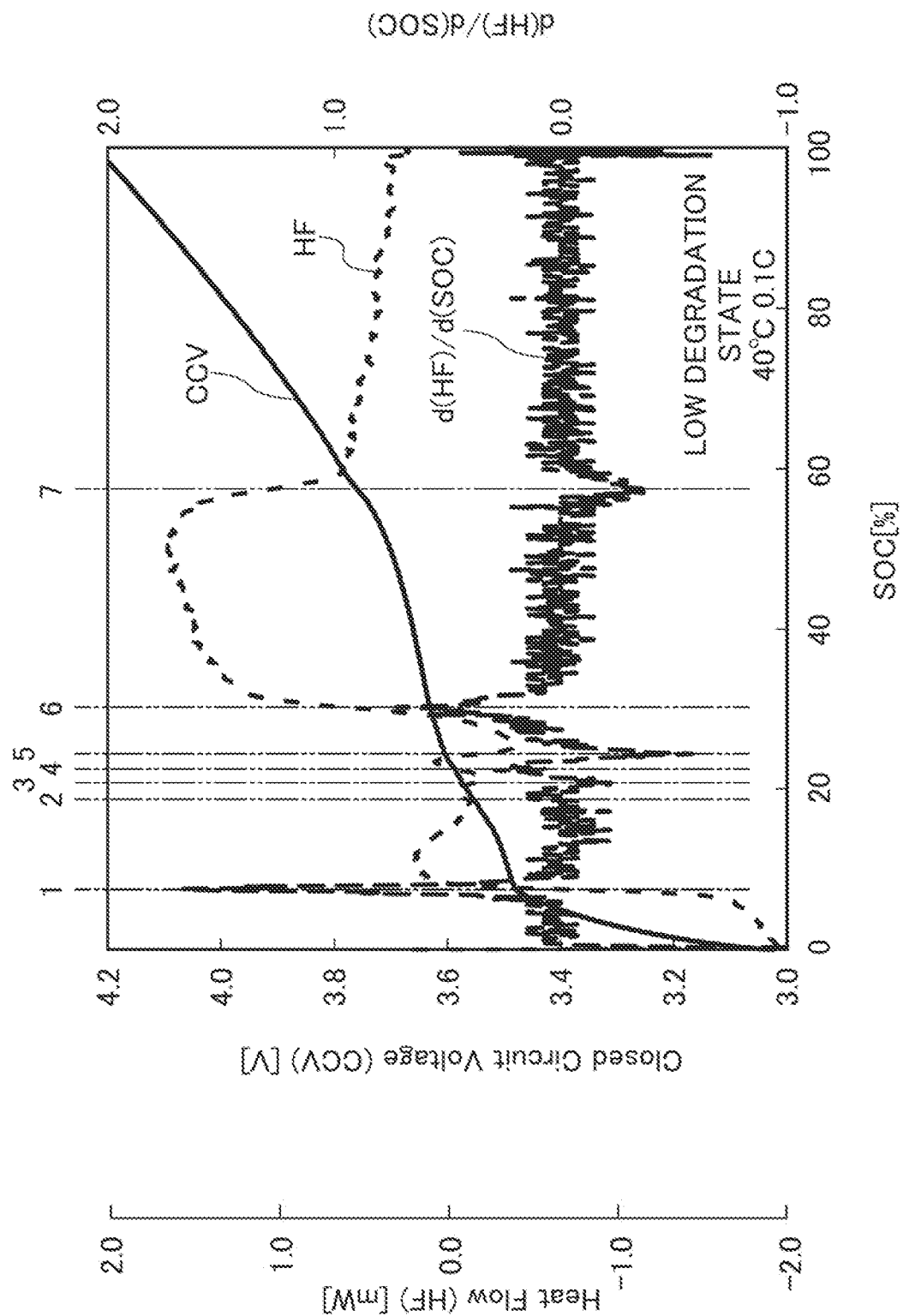
FIG. 4 illustrates, as an example, HF vs. SOC differential characteristics (in a low degradation state) of the embodiment.

FIG. 4 is a graph corresponding to the present embodiment, and shows, as an example, the HF vs. SOC characteristics and the differential characteristics thereof, i.e., differential characteristics d(HF)/d(SOC) of HF characteristics HF=f(SOC) with respect to the SOC. As shown in FIG. 4, in the case of, for example, a lithium-ion battery including graphite as a material for the negative electrode and NCM as a material for the positive electrode, the HF vs. SOC differential characteristics have a plurality of peaks 1 to 7 caused by, for example, phase transition of the graphite. The positions (states of charge) of these peaks are unlikely to deviate even when the battery cells are degraded. The peaks 7, 6, 5, 4, 3, 2, and 1 are increasingly unlikely to deviate, in this order. Thus, the battery state estimator 210 determines, as a SOC(HF), the SOC at the detected peak, by referring to the SOC at a peak of the differential characteristics of the HF vs. SOC initial characteristics stored in the storage 220.

At this time, the battery state estimator 210 calculates, based on the charge current and the charge time, the charge capacity from the start of charge to the time of detection of the peak, and calculates a SOC(OCV) based on the calculated charge capacity and the start SOC estimated from the table maps of the OCV vs. SOC characteristics at the start of charge as described above.

For example, according to the following formulas, the battery state estimator 210 calculates a ΔSOC corresponding to the calculated charge capacity Q(t), and calculates the SOC(OCV) from the calculated ΔSOC and the start SOC estimated from the table maps of the OCV vs. SOC characteristics at the time of start of charge.

$$SOC(OCV) = \text{start } SOC + \Delta SOC;$$

$$\Delta SOC = Q(t)/C0(t); \text{ and}$$

$$C0(t) = C0 \times SOH, \text{ wherein}$$

C0(t) is a present overall capacity,
C0 is an initial overall capacity,
SOH is a state of health, and
t is an elapsed time Here, if the SOH is accurately estimated, the ΔSOC is also considered to be accurately estimated, and the SOC(OCV) reflects a deviation of the start SOC estimated from the table maps of the OCV vs. SOC characteristics. The SOH can be determined by the following method, for example.

Figure 3D:
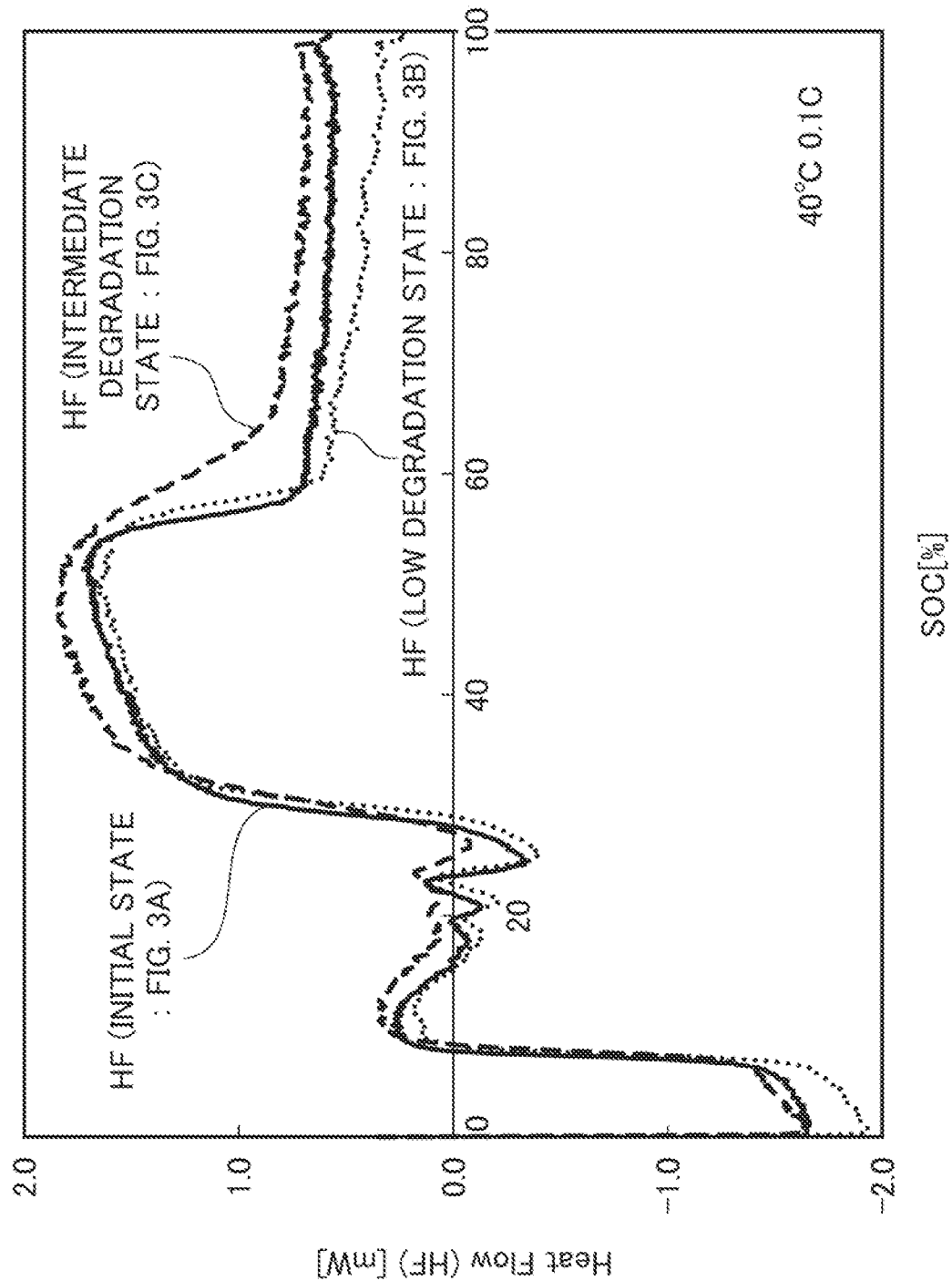
FIG. 3D illustrates, in a superimposed manner, the HF vs. SOC characteristics in the initial state shown in FIG. 3A, the HF vs. SOC characteristics in the low degradation state shown in FIG. 3B, and the HF vs. SOC characteristics in the intermediate degradation state shown in FIG. 3C.

For example, the battery state estimator 210 estimates a state of health SOH of the battery cells based on the measured HF vs. SOC present characteristics shown in FIG. 3B or 3C and the previously stored HF vs. SOC initial characteristics shown in FIG. 3A. FIG. 3D shows, in a superimposed manner, the HF vs. SOC initial characteristics shown in FIG. 3A, the HF vs. SOC characteristics in the low degradation state shown in FIG. 3B, and the HF vs. SOC characteristics in the intermediate degradation state shown in FIG. 3C.

Here, the lengths of line segments between the peaks of the HF vs. SOC differential characteristics shown in FIG. 4 correlate with the overall capacity of the battery cells in the case of a lithium-ion battery of the type of negative electrode cut. Therefore, if the lengths mAh of the line segments between these peaks are known, the overall capacity mAh of the battery cells can be calculated. For example, it is assumed that the initial capacity for SOC 0%-100% is 100 mAh, and the length of the line segment between arbitrary two peaks among the plurality of peaks is 20 mAh. The length mAh of the line segment between the peaks can be suitably calculated from the charge current and the charge time. When the degradation of the battery cells progresses and the length of the line segment between the two peaks decreases to 10 mAh, the overall capacity of the battery cells becomes equal to 50 mAh.

Therefore, the battery state estimator 210 stores in advance the lengths mAh of the line segments between the peaks of the differential characteristics of the HF vs. SOC initial characteristics. At the time of charge, the battery state estimator 210 measures the length mAh of the line segment between arbitrary two peaks of the differential characteristics of the HF vs. SOC present (degraded state) characteristics, and estimates a SOH according to the following formula.

$$SOH = \{\text{length } mAh \text{ of line segment between two peaks of differential characteristics of } HF \text{ vs.}$$
$$SOC \text{ present (degraded state) characteristics}\}/$$
$$\{\text{length } mAh \text{ of line segment between two peaks of differential characteristics of } HF \text{ vs.}$$
$$SOC \text{ initial characteristics}\}$$

Since charge is carried out with a constant current and at a low rate during actual use, the length mAh of the line segment between the peaks can be calculated from the charge current mA and the charge time h. This estimation does not require charge to be carried out from a SOC of 0% or up to a SOC of 100%, and therefore, makes it possible to estimate a SOH at the time of charge during actual use.

As described above, in the case where the SOC(OCV) calculated from the table maps of the OCV vs. SOC characteristics deviates with respect to the SOC(HF) determined based on the peak of the HF vs. SOC differential characteristics by an amount of deviation equal to or greater than a predetermined value, the battery state estimator 210 corrects the table maps of the OCV vs. SOC characteristics based on the amount of deviation. The correction can be suitably made by, for example, shifting the entire contents of the table maps uniformly (e.g., by the amount of deviation (SOC %)) in a lateral direction.

As described above, according to the SOC estimation correction of the present embodiment, SOC estimation for battery cells is corrected based on the HF vs. SOC differential characteristics, instead of the CCV vs. SOC differential characteristics. As described above, in comparison with the CCV vs. SOC differential characteristics, the HF vs. SOC differential characteristics have the feature in which:
- peaks have larger magnitudes, shaper spectra, lager S/N ratios, and maintain these characteristics even when the battery cells are degraded;
- the number of the peaks is greater and the intervals between the peaks are shorter; and
- plus peaks and minus peaks have a respective specific pattern, and even when the battery cells are degraded, the specific pattern maintains a certain pattern, in other words, the peaks are unlikely to deviate in position relative to the SOC even when the battery cells are degraded.

As a result, the SOC estimation for the battery cells can be corrected with improved accuracy, and the SOC can be estimated with improved accuracy.

In particular, the HF vs. SOC differential characteristics, in which a large number of peaks are present with short intervals interposed therebetween, allow correction of the SOC estimation even at the time of charge from various states of charge during actual use and even at the time of short-time charge during actual use.

Further, the HF vs. SOC differential characteristics, in which the plus peaks and minus peaks have a respective specific pattern, allow the position (SOC) of the peak of the HF vs. SOC differential characteristics to be easily identified based on whether the peak is plus or minus and the pattern of magnitude of the peak even at the time of charge from various states of charge during actual use, thereby facilitating correction of the SOC estimation.

Here, for actual use, a table map of an end-of-life (EOL) state is prepared as the table map of OCV vs. SOC characteristics in some cases. Alternatively, for actual use, a plurality of table maps are prepared according to degradation states, such as a begin-of-life (BOL) state, an end-of-life (EOL) state, and an intermediate degradation state therebetween, as the table maps of the OCV vs. SOC characteristics in some cases. In this respect, according to the correction of the SOC estimation of the present embodiment, since the table maps of the OCV vs. SOC characteristics can be corrected according to degradation, for example, only the table map of the initial state needs to be prepared.

With respect to the estimation of the SOC and SOH, it is generally known to use a technique according to which a mathematical model of a battery cell is constructed and the SOC and SOH are estimated using a state estimator created from the model. This estimation involves a fundamental problem in that when the battery model contains an error, the estimation accuracy decreases. Further, it cannot be determined whether or not the estimated value is correct while a battery is being used. In this regard, the embodiment of the present disclosure, according to which the HF characteristics are measured, makes it possible to correct an error contained in a mathematical model of a battery while the battery is being used.

(SOC Estimation Correction 2)

Next, described is an example of correction of SOC estimation for the battery cells 111 that the battery state estimator 210 performs based on an enthalpy potential of the battery cells 111, specifically, the UH vs. SOC characteristics, and more specifically, the UH vs. SOC differential characteristics.

When charge and discharge are not being performed, for example, when the vehicle is at standstill during actual use, the battery state estimator 210 periodically estimates a SOC of the battery cells 111 that corresponds to a detected OCV of the battery cells 111, by referring to the table maps of the OCV vs. SOC characteristics. At the time of a start of charge that is performed, for example, when the vehicle is at standstill during actual use, the battery state estimator 210 estimates, as a start SOC, a SOC of the battery cells 111 that corresponds to a detected OCV of the battery cells 111, by referring to the table maps of the OCV vs. SOC characteristics.

Thereafter, during the charge that is performed, for example, when the vehicle is at standstill during actual use, the battery state estimator 210 measures UH vs. SOC present characteristics of the battery cells 111 as illustrated in FIGS. 3B and 3C, and detects peaks of differential characteristics of the measured UH vs. SOC present characteristics.

Figure 5:
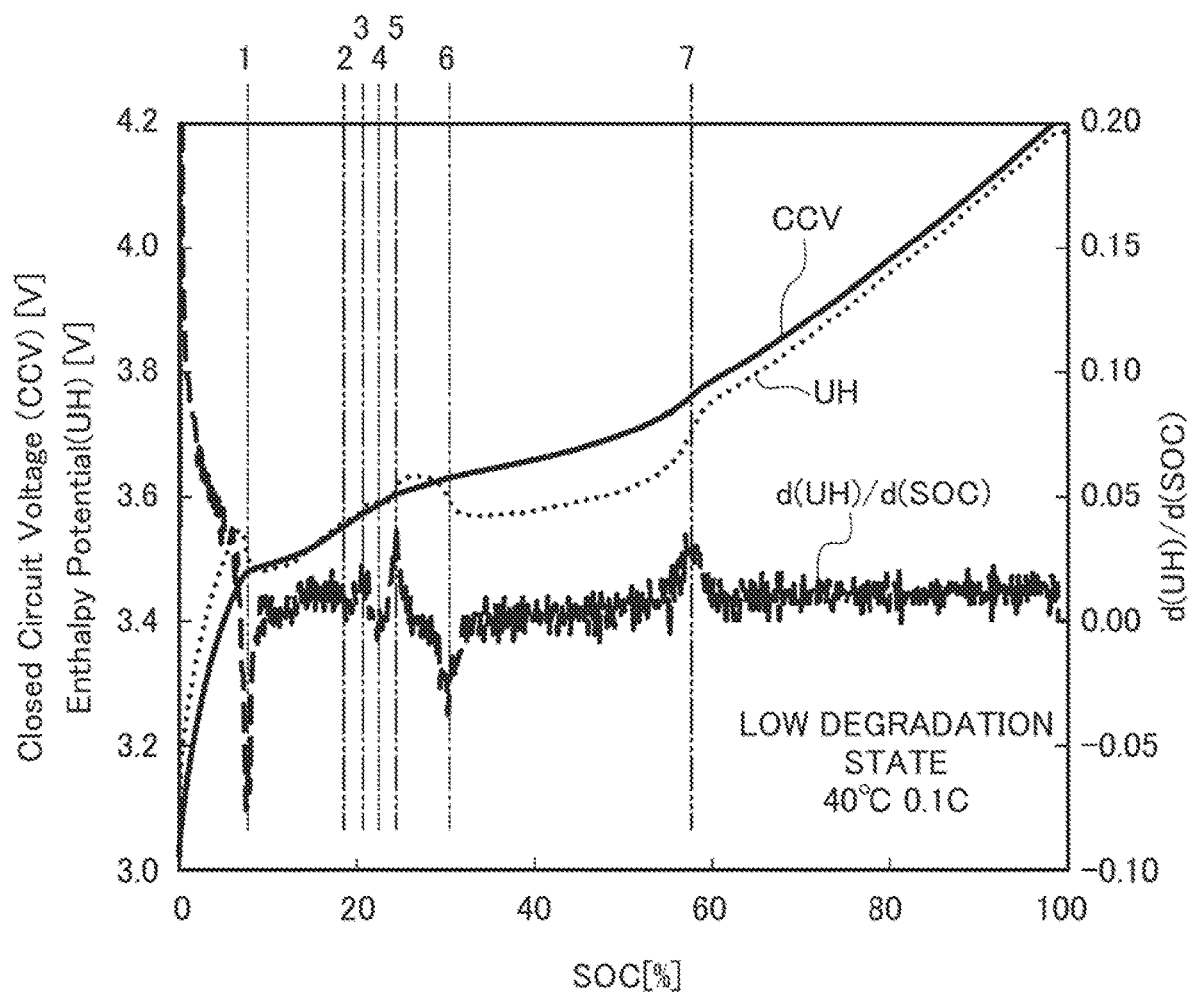
FIG. 5 illustrates, as an example, UH vs. SOC differential characteristics (in a low degradation state) of the embodiment.

Here, FIG. 5 is a graph corresponding to the present embodiment, and shows, as an example, the UH vs. SOC characteristics and the differential characteristics thereof, i.e., differential characteristics d(UH)/d(SOC) of UH characteristics UH=f(SOC) with respect to the SOC. As shown in FIG. 5, in the case of, for example, a lithium-ion battery including graphite as a material for the negative electrode and NCM as a material for the positive electrode, the UH vs. SOC differential characteristics have a plurality of peaks 1 to 7 caused by, for example, phase transition of the graphite. The positions (states of charge) of these peaks are unlikely to deviate even when the battery cells are degraded. The peaks 7, 6, 5, 4, 3, 2, and 1 are increasingly unlikely to deviate, in this order. Thus, the battery state estimator 210 determines, as a SOC(UH), the SOC at the detected peak, by referring to the SOC at a peak of the differential characteristics of the UH vs. SOC initial characteristics stored in the storage 220.

At this time, the battery state estimator 210 calculates, based on the charge current and the charge time, the charge capacity from the start of charge to the time of detection of the peak, and calculates a SOC(OCV) based on the calculated charge capacity and the start SOC estimated from the table map of the OCV vs. SOC characteristics at the start of charge as described above.

For example, according to the following formulas, the battery state estimator 210 calculates a ΔSOC corresponding to the calculated charge capacity Q(t), and calculates the SOC(OCV) from the calculated ΔSOC and the start SOC estimated from the table maps of the OCV vs. SOC characteristics at the time of start of charge.

$SOC(OCV) = \text{start } SOC + \Delta SOC;$ $\Delta SOC = Q(t)/C0(t);$ and $C0(t) = C0 \times SOH,$ wherein C0(t) is a present overall capacity,
C0 is an initial overall capacity,
SOH is a state of health, and
t is an elapsed time Here, if the SOH is accurately estimated, the ΔSOC is also considered to be accurately estimated, and the SOC(OCV) reflects a deviation of the start SOC estimated from the table maps of the OCV vs. SOC characteristics. The SOH can be determined by the following method, for example.

For example, the battery state estimator 210 estimates a state of health SOH of the battery cells based on the measured UH vs. SOC present characteristics shown in FIG. 3B or 3C and the previously stored UH vs. SOC initial characteristics shown in FIG. 3A.

Here, the lengths of line segments between the peaks of the UH vs. SOC differential characteristics shown in FIG. 5 correlate with the overall capacity of the battery cells in the case of a lithium-ion battery of the type of negative electrode cut. Therefore, if the lengths mAh of the line segments between these peaks are known, the overall capacity mAh of the battery cells can be calculated. For example, it is assumed that the initial capacity for SOC 0%-100% is 100 mAh, and the length of the line segment between arbitrary two peaks among the plurality of peaks is 20 mAh. The length mAh of the line segment between the peaks can be suitably calculated from the charge current and the charge time. When the degradation of the battery cells progresses and the length of the line segment between the two peaks decreases to 10 mAh, the overall capacity of the battery cells becomes equal to 50 mAh.

Therefore, the battery state estimator 210 stores in advance the lengths mAh of the line segments between the peaks of the differential characteristics of the UH vs. SOC initial characteristics. At the time of charge, the battery state estimator 210 measures the length mAh of the line segment between arbitrary two peaks of the differential characteristics of the UH vs. SOC present (degraded state) characteristics, and estimates a SOH according to the following formula.

SOH={length *mAh* of line segment between two peaks of differential characteristics of *UH* vs. *SOC* present (degraded state) characteristics}/ {length *mAh* of line segment between two peaks of differential characteristics of *UH* vs. *SOC* initial characteristics}

Since charge is carried out with a constant current and at a low rate during actual use, the length mAh of the line segment between the peaks can be calculated from the charge current mA and the charge time h. This estimation does not require charge to be carried out from a SOC of 0% or up to a SOC of 100%, and therefore, makes it possible to estimate a SOH at the time of charge during actual use.

As described above, in the case where the SOC(OCV) calculated from the table maps of the OCV vs. SOC characteristics deviates with respect to the SOC(UH) determined based on the peak of the UH vs. SOC differential characteristics by an amount of deviation equal to or greater than a predetermined value, the battery state estimator 210 corrects the table maps of the OCV vs. SOC characteristics based on the amount of deviation. The correction can be suitably made by, for example, shifting the entire contents of the table map uniformly (e.g., by the amount of deviation (SOC %)) in a lateral direction.

As described above, according to the SOC estimation correction of the present embodiment, SOC estimation for battery cells is corrected based on the UH vs. SOC differential characteristics, instead of the CCV vs. SOC differential characteristics. As described above, in comparison with the CCV vs. SOC differential characteristics, the UH vs. SOC differential characteristics also have the feature in which:

peaks have larger magnitudes, shaper spectra, lager S/N ratios, and maintain these characteristics even when the battery cells are degraded;

the number of the peaks is greater and the intervals between the peaks are shorter; and plus peaks and minus peaks have a respective specific pattern, and even when the battery cells are degraded, the specific pattern maintains a certain pattern, in other words, the peaks are unlikely to deviate in position relative to the SOC even when the battery cells are degraded.

As a result, the SOC estimation for the battery cells can be corrected with improved accuracy, and the SOC can be estimated with improved accuracy.

In particular, the UH vs. SOC differential characteristics, in which a large number of peaks are present with short intervals interposed therebetween, allow correction of the SOC estimation even at the time of charge from various states of charge during actual use and even at the time of short-time charge during actual use.

Further, the UH vs. SOC differential characteristics, in which the plus peaks and minus peaks have a respective specific pattern, allow the position (SOC) of the peak of the UH vs. SOC differential characteristics to be easily identified based on whether the peak is plus or minus and the pattern of magnitude of the peak even at the time of charge from various states of charge during actual use, thereby facilitating correction of the SOC estimation.

As described above, for actual use, a table map of an end-of-life (EOL) state is prepared as the table map of OCV vs. SOC characteristics in some cases. Alternatively, for actual use, a plurality of table maps are prepared according to degradation states, such as a begin-of-life (BOL) state, an end-of-life (EOL) state, and an intermediate degradation state therebetween, as the table maps of the OCV vs. SOC characteristics in some cases. In this respect, according to the correction of the SOC estimation of the present embodiment, since the table maps of the OCV vs. SOC characteristics can be corrected according to degradation, for example, only the table map of the initial state needs to be prepared.

While embodiments of the present disclosure have been described above, the present disclosure is not limited to the embodiments described above, and various modifications and changes may be made to the present disclosure. For example, in the case of SOC Estimation 1 described above, table maps of CCV vs. SOC characteristics may be corrected based on a heat flow of the battery cells, specifically HF vs. SOC characteristics, and more specifically HF vs. SOC differential characteristics.

More specifically, at the time of charge that is performed, for example, when the vehicle is at standstill during actual use, the battery state estimator 210 measures HF vs. SOC present characteristics of the battery cells 111 as illustrated in FIGS. 3B and 3C, and detects peaks of differential characteristics of the measured HF vs. SOC present characteristics, in the same manner as described above. The battery state estimator 210 determines, as a SOC(HF), the SOC at the detected peak, by referring to the SOC at a peak of the differential characteristics of the HF vs. SOC initial characteristics stored in the storage 220.

The battery state estimator 210 determines, as a SOC (CCV), a SOC corresponding to the CCV detected at the time of detection of the peak described above, by referring to one of the stored table maps of CCV vs. SOC characteristics that corresponds to a temperature and a current detected at the time of detection of the peak described above.

As described above, in the case where the SOC(CCV) calculated from the table maps of the CCV vs. SOC characteristics deviates with respect to the above-described SOC(HF) determined based on the peak of the HF vs. SOC differential characteristics by an amount of deviation equal to or greater than a predetermined value, the battery state estimator 210 corrects the table maps of the CCV vs. SOC characteristics based on the amount of deviation. The correction can be suitably made by, for example, shifting the entire contents of the table map uniformly (e.g., by the amount of deviation (SOC %)) in a lateral direction.

For actual use, a table map of an end-of-life (EOL) state is prepared as the table map of CCV vs. SOC characteristics in some cases. Alternatively, for actual use, a plurality of table maps are prepared according to degradation states, such as a begin-of-life (BOL) state, an end-of-life (EOL) state, and an intermediate degradation state therebetween, as the table maps of the CCV vs. SOC characteristics in some cases. In this respect, according to the correction of the SOC estimation of the present modification, since the table maps of the CCV vs. SOC characteristics can be corrected according to degradation, for example, only the table map of the initial state needs to be prepared.

Moreover, in the case of SOC Estimation 2 described above, table maps of CCV vs. SOC characteristics may be corrected based on an enthalpy potential of the battery cells, specifically UH vs. SOC characteristics, and more specifically UH vs. SOC differential characteristics.

More specifically, at the time of charge that is performed, for example, when the vehicle is at standstill during actual use, the battery state estimator 210 measures UH vs. SOC present characteristics of the battery cells 111 as illustrated in FIGS. 3B and 3C, and detects peaks of differential characteristics of the measured UH vs. SOC present characteristics, in the same manner as described above. The battery state estimator 210 determines, as a SOC(UH), the SOC at the detected peak, by referring to the SOC at a peak of the differential characteristics of the UH vs. SOC initial characteristics stored in the storage 220.

The battery state estimator 210 determines, as a SOC (CCV), a SOC corresponding to the CCV detected at the time of detection of the peak described above, by referring to one of the stored table maps of CCV vs. SOC characteristics that corresponds to a temperature and a current detected at the time of detection of the peak described above.

As described above, in the case where the SOC(CCV) calculated from the table maps of the CCV vs. SOC characteristics deviates with respect to the above-described SOC(UH) determined based on the peak of the UH vs. SOC differential characteristics by an amount of deviation equal to or greater than a predetermined value, the battery state estimator 210 corrects the table maps of the CCV vs. SOC characteristics based on the amount of deviation. The correction can be suitably made by, for example, shifting the entire contents of the table map uniformly (e.g., by the amount of deviation (SOC %)) in a lateral direction.

As described above, for actual use, a table map of an end-of-life (EOL) state is prepared as the table map of CCV vs. SOC characteristics in some cases. Alternatively, for actual use, a plurality of table maps are prepared according to degradation states, such as a begin-of-life (BOL) state, an end-of-life (EOL) state, and an intermediate degradation state therebetween, as the table maps of the CCV vs. SOC characteristics in some cases. In this respect, according to the correction of the SOC estimation of the present modification, since the table map of the CCV vs. SOC characteristics can be corrected according to degradation, for example, only the table map of the initial state needs to be prepared.

EXPLANATION OF REFERENCE NUMERALS

100: Battery unit
101: Case
102: Cover
103: Lower frame
104: Upper frame
105: Cooling plate
106: Air introduction mechanism
110: Battery module
111: Battery cell
112: Stack
113: End plate
114: Cell bus bar
119: Module bus bar
120: Battery heat flow detector
130: Reference heat flow detector
141: Voltage detector
142: Current detector
143: Temperature detector
200: Battery management system (BMS)
210: Battery state estimator
220 Storage

What is claimed is:

1. A battery unit comprising:
a battery module including a battery cell;
a voltage detector configured to detect an open circuit voltage or a closed circuit voltage of the battery cell;
a current detector configured to detect a current of the battery cell;
a battery heat flow detector configured to detect a heat flow of the battery cell;
a storage configured to store (A1) and (A2) below,
(A1): a table map of open circuit voltage OCV vs. state of charge SOC characteristics of the battery cell, and
(A2): heat flow HF vs. SOC initial characteristics of the battery cell, and states of charges at peaks of differential characteristics of the HF vs. SOC initial characteristics; and
a battery state estimator configured to estimate a SOC of the battery cell corresponding to a detected open circuit voltage of the battery cell, based on (A1) above, wherein
at a start of charge of the battery cell, the battery state estimator estimates, as a start SOC, a SOC of the battery cell corresponding to the open circuit voltage of the battery cell detected by the voltage detector, based on (A1) above,
during the charge of the battery cell, the battery state estimator measures HF vs. SOC present characteristics of the battery cell, based on the heat flow of the battery cell detected by the battery heat flow detector, detects a peak of differential characteristics of the measured HF vs. SOC present characteristics, and determines a SOC at the detected peak as a SOC(HF), based on (A2) above,
the battery state estimator calculates a charge capacity from the start of the charge to detection of the peak, based on a charge current detected by the current detector and a charge time, and calculates a SOC (OCV) based on the calculated charge capacity and the start SOC estimated at the start of the charge, and
in a case where the SOC(OCV) deviates with respect to the SOC(HF) by an amount of deviation equal to or greater than a predetermined value, the battery state estimator corrects (A1) above based on the amount of deviation.

2. The battery unit according to claim 1, wherein the battery state estimator
estimates a SOH of the battery cell, from a ratio between a length mAh of a line segment between peaks of the differential characteristics of the measured HF vs. SOC present characteristics and a length mAh of a line segment between the peaks of the differential characteristics of the HF vs. SOC initial characteristics stored in the storage,
calculates ΔSOC corresponding to the calculated charge capacity Q(t), according to formulas below;

$\Delta SOC = Q(t)/C0(t)$; and $C0(t) = C0 \times SOH$, wherein

C0(t) is a present overall capacity,
C0 is an initial overall capacity, and
t is an elapsed time, and
calculates the SOC(OCV) based on the calculated ΔSOC and the start SOC estimated at the start of the charge.

3. The battery unit according to claim 1, wherein
the storage further stores (A11) below, (A11): a table map of closed circuit voltage CCV vs. SOC characteristics of the battery cell, and
the battery state estimator determines, based on (A11) above, a SOC(CCV) corresponding to a closed circuit voltage detected by the voltage detector upon detection of a peak, and
in a case where the SOC(CCV) deviates with respect to the SOC(HF) by an amount of deviation equal to or greater than a predetermined value, the battery state estimator corrects (A11) above based on the amount of deviation.

4. The battery unit according to claim 2, wherein
the storage further stores (A11) below, (A11): a table map of closed circuit voltage CCV vs. SOC characteristics of the battery cell, and
the battery state estimator determines, based on (A11) above, a SOC(CCV) corresponding to a closed circuit voltage detected by the voltage detector upon detection of a peak, and
in a case where the SOC(CCV) deviates with respect to the SOC(HF) by an amount of deviation equal to or greater than a predetermined value, the battery state estimator corrects (A11) above based on the amount of deviation.

5. A battery unit comprising:
a battery module including a battery cell;
a voltage detector configured to detect an open circuit voltage or a closed circuit voltage of the battery cell;
a current detector configured to detect a current of the battery cell;
a battery heat flow detector configured to detect a heat flow of the battery cell;
a storage configured to store (A1) and (A3) below,
(A1): a table map of open circuit voltage OCV vs. state of charge SOC characteristics of the battery cell, and
(A3): enthalpy potential UH vs. SOC initial characteristics of the battery cell and states of charges at peaks of differential characteristics of the UH vs. SOC initial characteristics, an enthalpy potential UH being calculated according to a formula that is based on a closed circuit voltage CCV, a heat flow HF, and a current I, and is written as UH=CCV−HF/I; and
a battery state estimator configured to estimate a SOC of the battery cell corresponding to a detected open circuit voltage of the battery cell, based on (A1) above, wherein
at a start of charge of the battery cell, the battery state estimator estimates, as a start SOC, a SOC of the battery cell corresponding to the open circuit voltage of the battery cell detected by the voltage detector, based on (A1) above,
during the charge of the battery cell, the battery state estimator measures UH vs. SOC present characteristics of the battery cell, based on the heat flow HF, the closed circuit voltage CCV, and the current I of the battery cell that are detected by the battery heat flow detector, the voltage detector, and the current detector, respectively, detects a peak of differential characteristics of the measured UH vs. SOC present characteristics, and determines a SOC at the detected peak as a SOC(UH), based on (A3) above,
the battery state estimator calculates a charge capacity from the start of the charge to detection of the peak, based on a charge current detected by the current detector and a charge time, and calculates a SOC(OCV) based on the calculated charge capacity and the start SOC estimated at the start of the charge, and
in a case where the SOC(OCV) deviates with respect to the SOC(UH) by an amount of deviation equal to or greater than a predetermined value, the battery state estimator corrects (A1) above based on the amount of deviation.

6. The battery unit according to claim 5, wherein the battery state estimator
estimates a SOH of the battery cell, from a ratio between a length mAh of a line segment between peaks of the differential characteristics of the measured UH vs. SOC present characteristics and a length mAh of a line segment between the peaks of the differential characteristics of the measured UH vs. SOC initial characteristics stored in the storage,
calculates ΔSOC corresponding to the calculated charge capacity Q(t), according to formulas below;

$\Delta SOC = Q(t)/C0(t)$; and $C0(t) = C0 \times SOH$, wherein

C0(t) is a present overall capacity,
C0 is an initial overall capacity, and
t is an elapsed time, and
calculates the SOC(OCV) based on the calculated ΔSOC and the start SOC estimated at the start of the charge.

7. The battery unit according to claim 5, wherein
the storage further stores (A11) below, (A11): a table map of closed circuit voltage CCV vs. SOC characteristics of the battery cell, and
the battery state estimator determines, based on (A11) above, a SOC(CCV) corresponding to a closed circuit voltage detected by the voltage detector upon detection of a peak, and
in a case where the SOC(CCV) deviates with respect to the SOC(UH) by an amount of deviation equal to or greater than a predetermined value, the battery state estimator corrects (A11) above based on the amount of deviation.

8. The battery unit according to claim 6, wherein
the storage further stores (A11) below,
(A11): a table map of closed circuit voltage CCV vs. SOC characteristics of the battery cell, and
the battery state estimator determines, based on (A11) above, a SOC (CCV) corresponding to a closed circuit voltage detected by the voltage detector upon detection of a peak, and
in a case where the SOC(CCV) deviates with respect to the SOC(UH) by an amount of deviation equal to or greater than a predetermined value, the battery state estimator corrects (A11) above based on the amount of deviation.

9. The battery unit according to claim 1, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

10. The battery unit according to claim 2, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

11. The battery unit according to claim 3, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

12. The battery unit according to claim 4, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

13. The battery unit according to claim 5, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

14. The battery unit according to claim 6, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

15. The battery unit according to claim 7, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

16. The battery unit according to claim 8, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

* * * * *